United States Patent [19]
Bianca et al.

[11] Patent Number: 5,957,725
[45] Date of Patent: *Sep. 28, 1999

[54] CONTINUOUS MOLDED PLASTIC COMPONENTS OR ASSEMBLIES

[75] Inventors: Giuseppe Bianca, Temecula; Robert M. Bogursky, Encintas, both of Calif.

[73] Assignee: Auto Splice Systems Inc., San Diego, Calif.

[*] Notice: This patent is subject to a terminal disclaimer.

[21] Appl. No.: 08/761,899

[22] Filed: Dec. 9, 1996

Related U.S. Application Data

[63] Continuation-in-part of application No. 08/755,298, Nov. 22, 1996, Pat. No. 5,725,392, which is a continuation-in-part of application No. 08/498,536, Jul. 5, 1995, Pat. No. 5,616,053.

[51] Int. Cl.⁶ .................................................. H01R 13/40
[52] U.S. Cl. ............................................ 439/590; 439/937
[58] Field of Search ............................. 439/78, 590, 736, 439/885, 937; 29/842, 883, 884; 264/255, 308

[56] References Cited

U.S. PATENT DOCUMENTS

| | | | |
|---|---|---|---|
| 2,396,725 | 3/1946 | Thomas, Jr. ............................. | 173/324 |
| 3,471,900 | 10/1969 | Burns ........................................... | 18/36 |
| 4,230,387 | 10/1980 | Zahn . | |
| 4,391,482 | 7/1983 | Czeschka . | |
| 4,404,744 | 9/1983 | Stenz et al. ................................ | 29/883 |
| 4,617,733 | 10/1986 | Olson ......................................... | 29/874 |
| 4,655,517 | 4/1987 | Bryce . | |
| 4,686,766 | 8/1987 | Dubbs et al. .............................. | 29/883 |
| 4,832,622 | 5/1989 | Zahn ........................................ | 439/590 |
| 4,961,895 | 10/1990 | Klein ....................................... | 264/40.6 |

FOREIGN PATENT DOCUMENTS

| | | |
|---|---|---|
| 0753901 A | 1/1997 | European Pat. Off. . |
| 2162378 A | 7/1973 | France . |
| 2389254 A | 11/1978 | France . |
| 2060476 A | 5/1981 | United Kingdom . |

*Primary Examiner*—Khiem Nguyen

[57] ABSTRACT

A continuous electrical connector or component part of plastic or metal manufactured by injection molding of axial segments in sequence. A novel in-line interlocking structure is provided for interlocking adjacent segments. The interlocking structure comprises overmolded end units wherein the next overmolded part fills in a hole or recess left in the previous molded part. Electrical or mechanical parts may, if desired, be simultaneously incorporated in the units of each segment during the molding process.

49 Claims, 13 Drawing Sheets

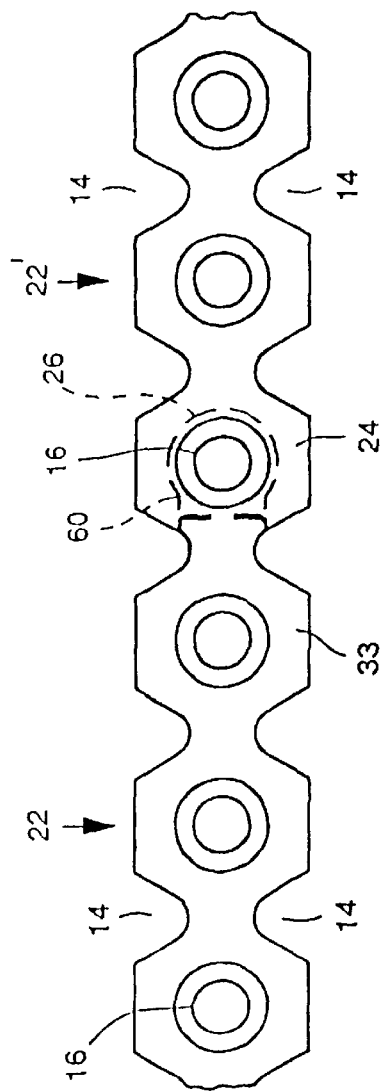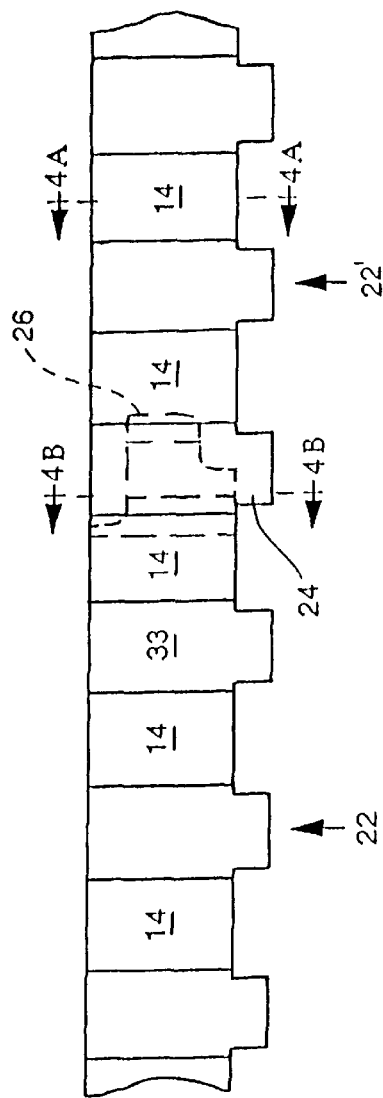

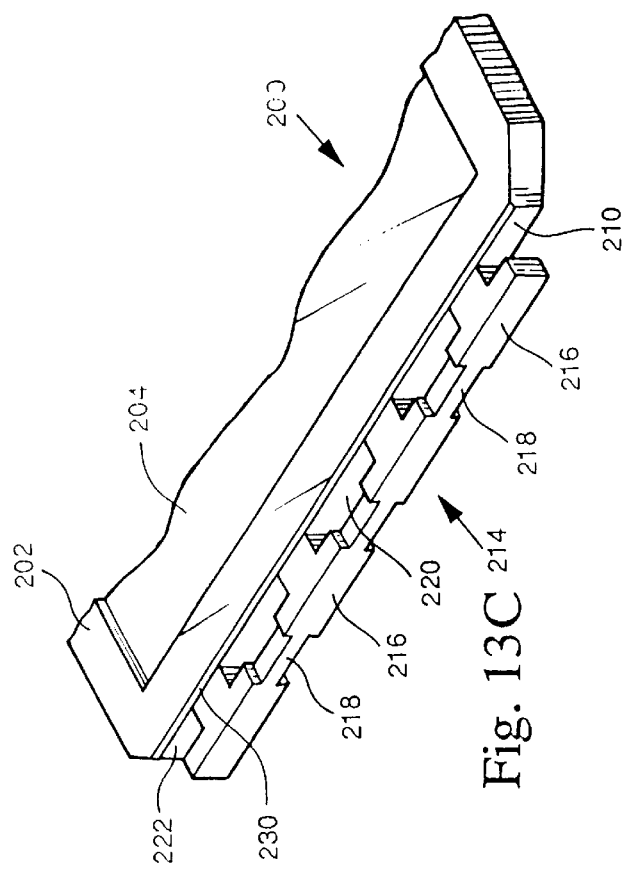
Fig. 13C
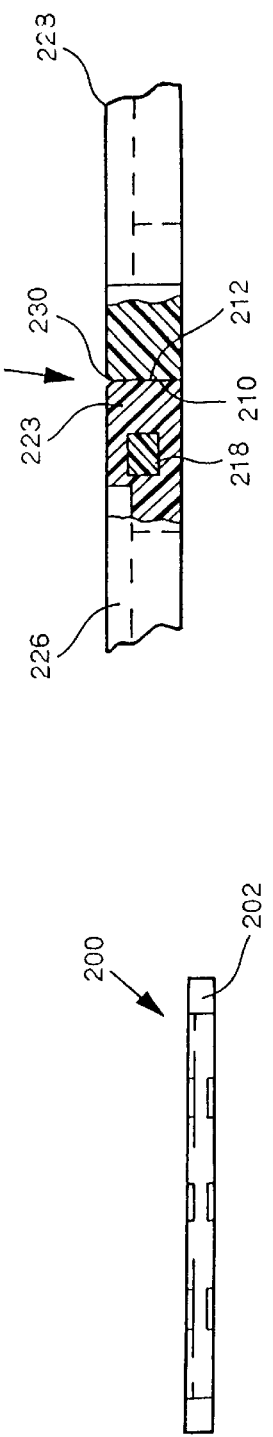
Fig. 13D
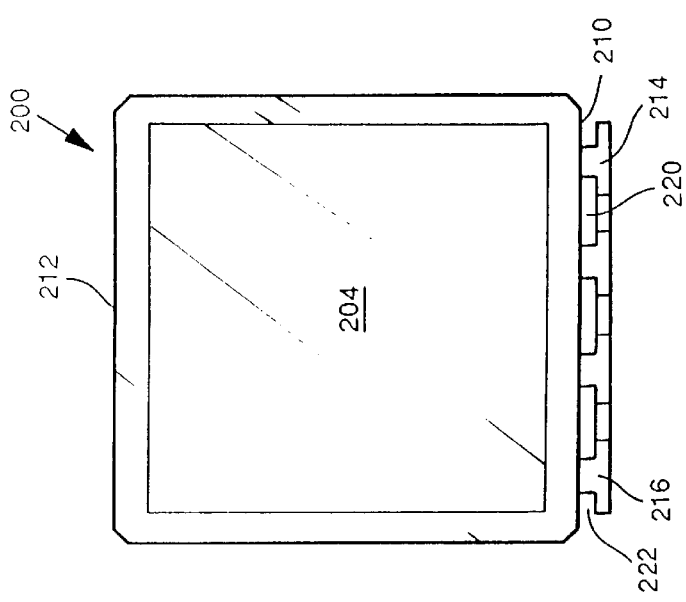
Fig. 13A
Fig. 13B

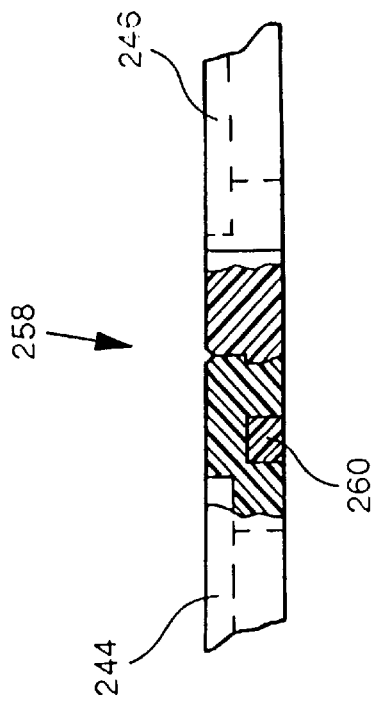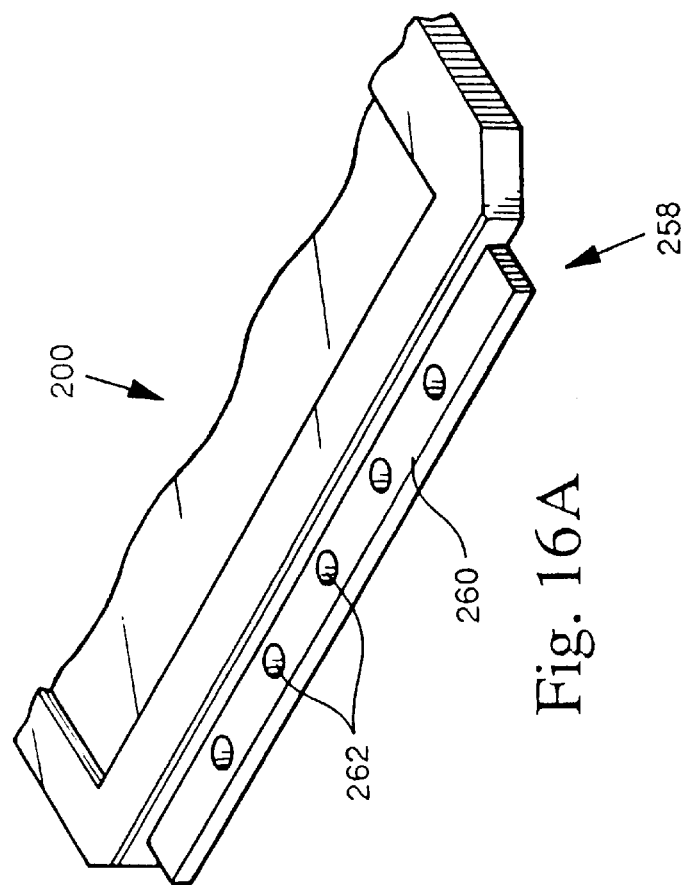

CONTINUOUS MOLDED PLASTIC COMPONENTS OR ASSEMBLIES

RELATED APPLICATIONS

This application is a continuation-in-part of a second commonly-assigned, patent application, Ser. No. 08/755,298, filed Nov. 22, 1996, entitled "Continuous Molded Electrical Connector With Pins" now U.S. Pat. No. 5,725,392. which is a continuation-in-part of a first commonly-assigned, patent application, Ser. No. 08/498,536, filed Jul. 5, 1995 now U.S. Pat. No. 5,616,053.

This invention relates to the manufacture of continuous molded plastic components or assemblies and to the resultant strip of molded plastic material with or without added elements.

BACKGROUND OF THE INVENTION

Electrical connectors comprising an insulating body having electrical contacts carried thereby are well known in the art. In the so-called male pin connectors, the insulating body carries pin-like contacts which extend above and below the insulating body to facilitate electrical connection from one element, such as a printed circuit board (PCB), to another element, which may, for example, comprise a so-called female connector. As is well known, a female connector comprises an insulating body which carries an electrical contact which is generally capable of receiving at one end thereof a male pin, and at the other end thereof an electrical conductor which may be another male pin, a single electrical conductor, or a single strand of a multiconductor flat ribbon cable. Typically, the aforedescribed male connector and female connector are utilized in a tandem or coupled fashion to provide electrical connection from one element such as the printed circuit paths on a PCB to individual conductors or the multiple conductors of a multiconductor ribbon cable.

The aforedescribed male and female type connectors are generally manufactured with a predetermined number of contacts carried thereby. For example, a typical male connector of the type described above might comprise a length of insulating material having two, ten, twenty, thirty, or any number of pins carried thereby. Similarly, a female connector may comprise a body of insulating material having individual cavities disposed therein, each cavity of which carries an electrical contact. Like the male connectors, the female connectors are commonly manufactured with two, ten, twenty, thirty, etc., contacts.

There are drawbacks associated with the manufacture and use of both male and female connectors of the type described above. The end user may use several connectors, each having a different number of electrical contacts or "positions". He must therefore purchase and inventory many different connector sizes, i.e. he must maintain a supply of 8-position, 12-position, 20-position connectors, etc.

A continuous connector strip for solving this problem was disclosed in U.S. Pat. No. 4,230,387. U.S. Pat. No. 4,832,622 (the '622 patent), whose contents are herein incorporated by reference, describes a better solution to the problem involving continuous extrusion or semi-continuous injection molding. Problems with the continuous extrusion scheme are that only simple header configurations are possible, and the extruded strip must in a subsequent step have holes punched and notches formed. While the semi-continuous injection molding scheme avoids the foregoing problems, it also has drawbacks, which will be best understood from the description given in the copending application, Ser. No. 08/498,536, and involve, briefly put, maintaining the proper pitch for elements added to the molded strip, and the possibility of weak joints where the discrete segments are joined together causing the two discretely molded segments to separate during the interconnecting device insertion process, shipment or during the end user's assembly process.

The copending application, Ser. No. 08/498,536, shows one possible solution to the problem involving, in accordance with one aspect of that invention, providing each segment with a trailing projecting portion, substantially in-line with the strip, with undercuts or recessed regions behind the projecting portion. The projecting portion of each previously-molded segment is reinserted in the mold and the leading portion of the next segment molded over and around the projecting portion to provide a strong interlocking structure substantially in-line with the connector strip. In a preferred embodiment, the projecting portion has a hole for receiving an electrical or mechanical part, and the over-molded part also has a hole, with both holes aligned to receive the electrical or mechanical part. In this way, despite the fact that the resultant interlocking structure is in-line in the strip, a space for an electrical or mechanical part is not lost, so that for an application where, say, electrical pins are provided in evenly-spaced holes in the strip, a pin can also be placed in the aligned holes of the interlocking structure to maintain the symmetry.

The second copending application, Ser. No. 08/755,298, shows another possible solution to the problem involving, in accordance with one aspect of that invention, providing the electrical or mechanical parts to be added to the molded strip in the mold when the electrically-insulating parts are molded, with the result that the previously-molded segment including the projecting portion already incorporates the electrical or mechanical parts and thus in the next cycle the projecting portion need only be overmolded with electrically-insulating material to form a solid interlocking structure. This embodiment offers the advantage that it is not necessary as a separate step to insert the electrical or mechanical parts in the holes in the completed strip following the molding step.

SUMMARY OF THE INVENTION

An object of the invention is an improved semi-continuous molding process for molding a continuous strip of material with holes for receiving electrical or mechanical parts.

Another object of the invention is a continuous strip of parts or components of injection molded insulating material which can be used for any purpose that requires a plastic part for separate use or for assembly into a larger structure. Preferably, the strip is provided with severance means, such as notches or score marks, for severing from the strip a discrete length of the material containing one or more components for any of many uses, such as, for example, as part of a package for various items, said strip having been made by separately molding discrete segments, wherein the discrete segments are interconnected by a strong interlocking structure.

In accordance with one aspect of the present invention, each segment has a trailing projecting portion, substantially in-line with the strip, with undercuts or recessed regions behind the projecting portion. The projecting portion of each previously-molded segment is reinserted in the mold and the leading portion of the next segment molded over and around the projecting portion to provide a strong interlocking structure substantially in-line with the strip.

In a preferred embodiment, the projecting portion has a hole for receiving an overmolded part, with the overmolded part helping to lock the previous segment to the next molded segment in a positive manner. In a preferred embodiment, the projecting portion has the shape of a tongue with a hole formed by a cross-positioned core pin, and the overmolded part has the shape of a groove with a hole-engaging cross bar formed when the next segment is molded with the projecting portion of the previous segment reinserted back into the mold. Alternatively, the shapes are reversed with a holed groove on the projecting portion and the tongue with cross bar overmolded over the groove. The resultant interlocking structure is in-line in the strip. Due to the overmolding, the hole in the tongue or groove is not visible in the molded strip.

In accordance with another preferred embodiment, the projecting portion of the interlocking structure comprises a strip extending laterally of the longitudinal dimension of the strip and provided with laterally spaced recesses or holes around or through which flows fluid material during the next molding cycle to completely enclose all parts of the projecting portion. This not only provides a secure connection between successive segments or components of the strip, but also ensures that the strength of the interlocking structure is approximately that of the link separating successive components and that no parts of the interlocking section can separate from the adjacent segment during severing of a component from the strip. Thus, a scrapless continuous plastic product results.

The invention is applicable not only to injection molded insulating plastic materials, but also to other similarly formable materials and processes. Typical insulating plastics such as ABS, PPA, polyesters, and polycarbonates can be used to make insulating parts, as well as silicone rubber materials. In addition, the parts can be made electrically-conductive by using electrically conductive plastics or by compounding insulating material with stainless steel fibers, carbon fibers or carbon powder. The formable material can also include fibers for reinforcement, such as glass fibers. In addition, the invention is also applicable to the molding of metals, typically low-melting-point metals such as zinc. The process of injection molding of zinc is called die casting, but the process is very similar to the injection molding of plastics in that the zinc is melted and as a fluid is injected under pressure into a die or mold using using runners to direct the molten metal into a cavity or cavities, and cores if desired may also be introduced to make more complex shapes. For further information, reference is made to "Product Design For Die Casting", published in 1996 by the Diecasting Development Council, 4th Ed., Ch. 4, Pgs. 97–102, whose contents are herein incorporated by reference. Thus, the terms "molded", "injection-molded", "moldable", or "molding" as used herein should be understood in the broadest sense to include not only injection molding of plastics or other formable materials but also die casting of metals.

These and other objects and attainments together with a fuller understanding of the invention will become apparent and appreciated by referring to the following descriptions and claims taken in conjunction with the accompanying drawings which illustrate by way of example and not limitation preferred embodiments of the invention and wherein like reference numerals denote like or corresponding parts.

SUMMARY OF THE DRAWINGS

In the drawings:

FIGS. 5 and 6 are plan and elevational views, respectively, of the segment of FIG. 4;

FIGS. 13A, 13B, and 13C are, respectively, a top plan view, an elevational end view, and a partial perspective view of one form of plastic part in accordance with the present invention as if individually molded with its laterally projecting part which is overmolded in the next molding cycle in accordance with the invention;

FIG. 13D is a partially cross-sectional view of the interlocking structure formed when the segment of FIG. 13C is overmolded in the next molding cycle;

FIGS. 16A and 16B are views similar to FIGS. 13C and 13D, respectively, of another form of plastic part in accordance with the present invention.

DETAILED DESCRIPTION OF PREFERRED EMBODIMENTS

The '622 patent illustrates various pin header configurations available from a continuous strip of insulating material with holes filled with contact elements. For a better understanding of the present invention, reference is made to FIGS. 1–10 which illustrate examples of the embodiments described and claimed in the referenced copending applications.

Figure 1:
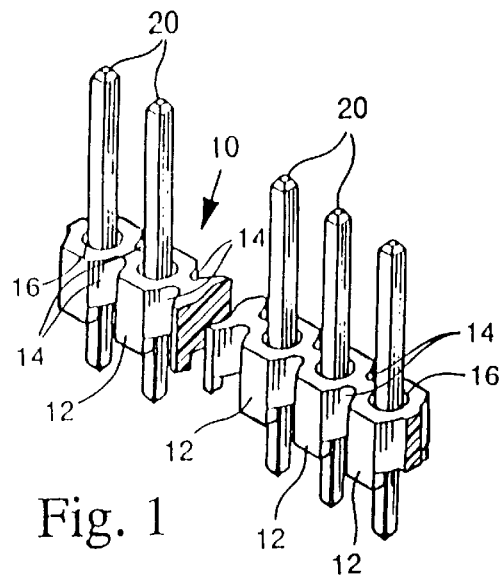
FIGS. 1 and 2 are perspective view of continuous strips of one row and two rows, respectively, of pin connectors in accordance with the invention.
Figure 2:
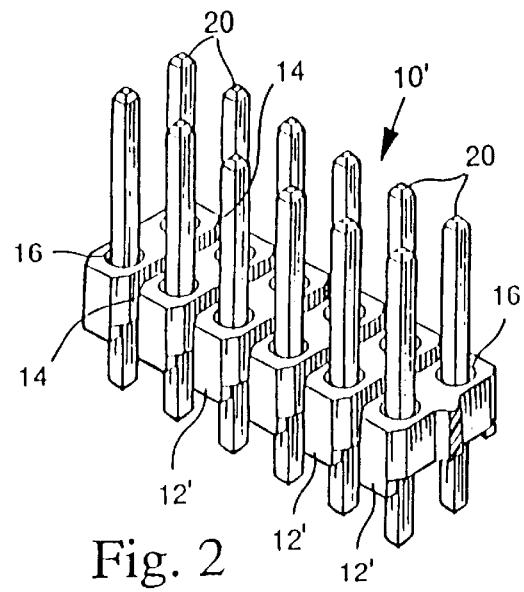

FIGS. 1 and 2 illustrate comparable parts available from a continuous strip according to the invention of the first copending application. The continuous strip 10 comprises, integrally connected, individual units 12 separated by severance means, in this instance spaced pairs of notches 14 between each unit 12 forming weakened regions where the strip can easily be severed to form one or multiple pin headers. The notches also assist in flexing of the strip for later coiling on a reel, provides a convenient reference point for indexing of the strip, and determines a specific web size between units 12 to control unit spacing. Each of the units 12 in this case have vertical through-holes 16, beveled 18 at the top or bottom, for receiving straight pin terminals 20.

The pins 20 have a substantially square cross section, or alternatively of a different cross-section, such as round or rectangular, and also may have an expanded "star" section in the area covered by the plastic header for improved strength and for form-fitting with the insulating plastic to prevent longitudinal displacement of the inserted pins. The sides of the strip 10 have the notches 14 formed therein, which notches are substantially U-shaped. The U-shaped notches 14 are directed substantially perpendicular to the longitudinal axis of the strip 10. By severing the strip at the two opposing notches, an electrical connector having a predetermined number of pin terminals can be formed. In the description which follows, the method of the invention will be described in connection with the manufacture of a single-row connector. However, other connectors, such as those shown in FIG. 2 and in FIGS. 2–4 of the '622 patent, can be manufactured in accordance with the invention.

FIG. 2 is a view of a double-row strip 10' according to the invention, with each unit 12 containing two holes 16 each containing a pin 20, with each unit 12' separated by pairs of notches 14. In this case, the strip 10' is wider than the strip shown in FIG. 1 so that pairs of holes 16 can be formed for receiving the two rows of straight pins 20.

The method according to the invention is not limited to the formation of continuous connector strip having straight pin terminals. FIG. 3B of the '622 patent shows an end view of an endless connector having right-angle pin terminals inserted in holes formed in the strip, and FIG. 4B of the '622 patent shows a strip having two rows of right-angle pin terminals. Although the connector strip shown are provided with pin terminals, it is apparent that an electrical connector can be manufactured according to the invention having any type of electrical components inserted in the continuous insulating strip.

Figure 3:
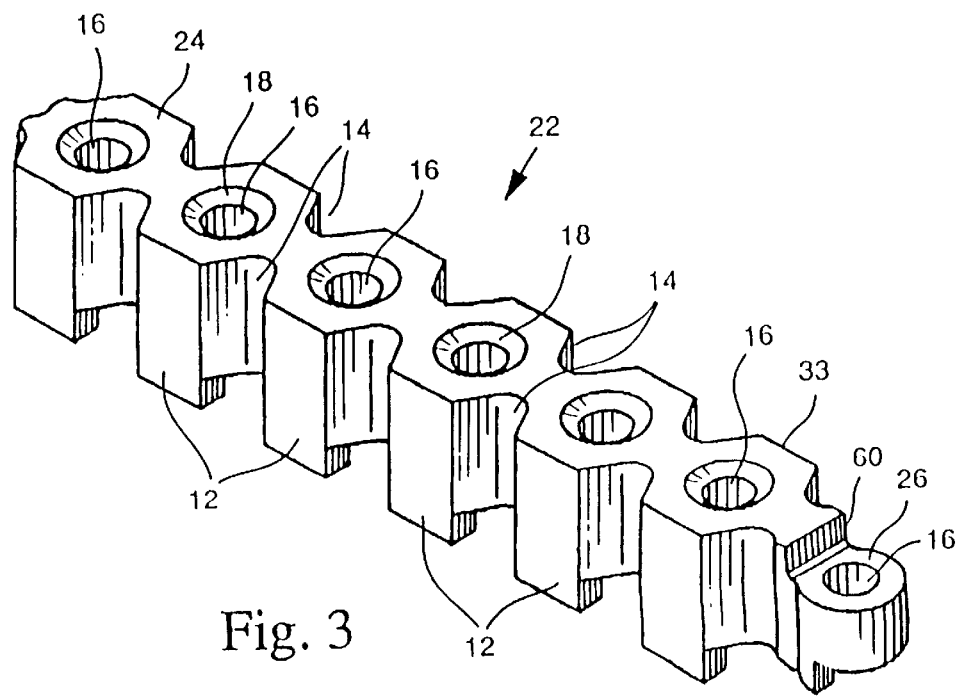
FIG. 3 is a perspective view of one molded segment of a continuous connector strip as shown in FIG. 1.

FIG. 3 illustrates what is herein termed one segment 22 of the continuous strip, which is made up of a plurality of such segments 22 interlocked or fused together. Each segment 22 is constituted of a plurality of units 12, and includes end units comprised of a leading end unit 24 and a trailing end unit 26 (explained below), each with the approximately same sized hole 16 as the middle units 12 between the end units 24, 26.

Figure 7:
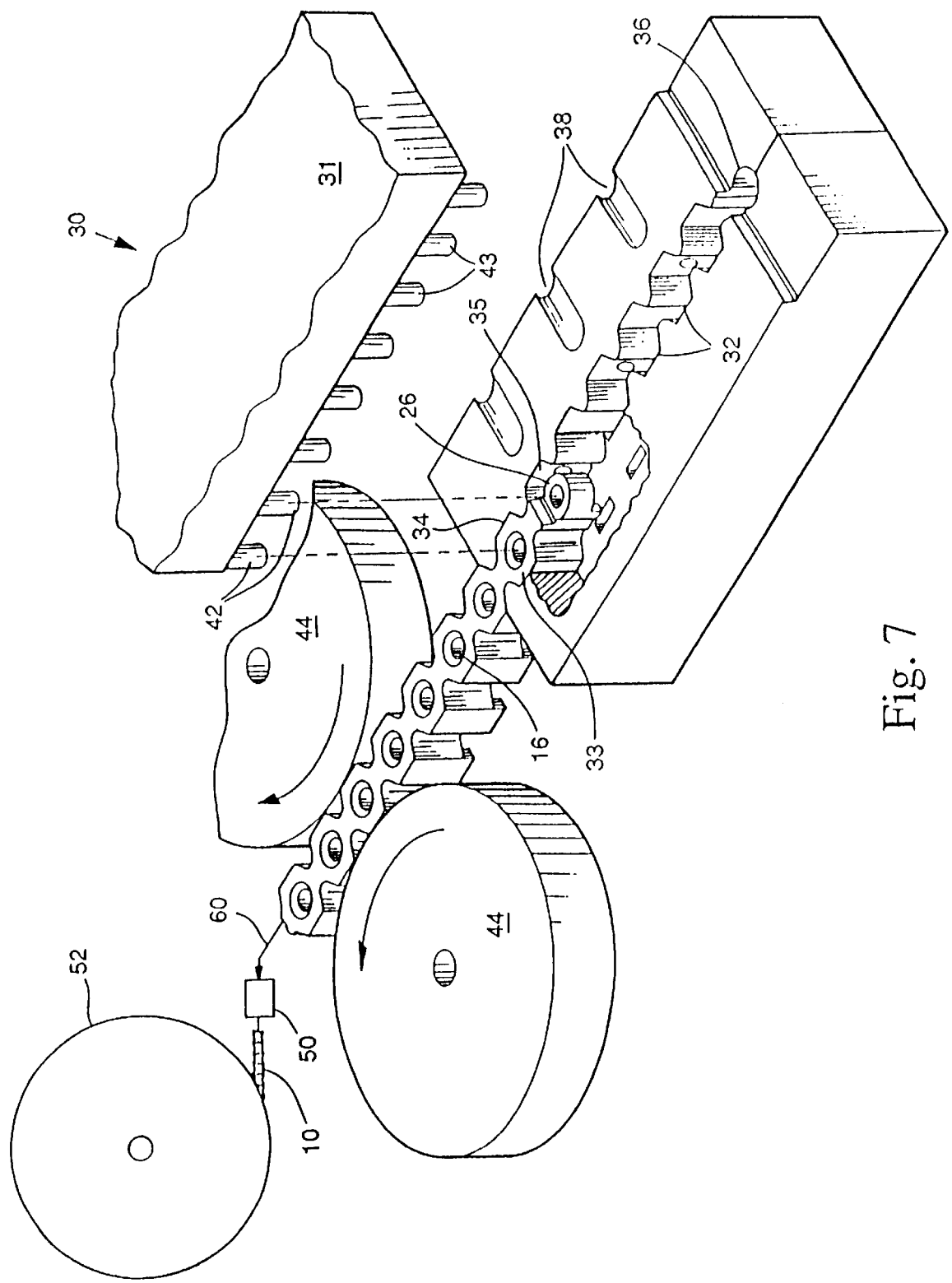
FIG. 7 illustrates manufacture of a continuous strip according to FIG. 4.

A feature of the invention is the use of the end units 24, 26 of adjacent segments 22 to form a strong interlocking structure connecting the discretely molded segments 22 into a continuous strip 10. This is accomplished with an improved style of interlocking feature, which in addition in accordance with one embodiment of the invention also uses core pins in the mold cavity to assure positive alignment of the previously molded segment. A typical injection mold for plastic material is shown in FIG. 7 at 30, divided into 2 halves. The mold top 31, which seals off the mold cavities 32 at top, is shown separately for simplicity. The cavities 32 have the configuration to mold a single segment 22, with the cavity 34 at the left end for receiving the previously molded segment unit 33 next to the previously molded trailing end unit 26, the cavity 35 next to the end cavity 34 for receiving the trailing end unit 26 of the previously molded segment and for overmolding over the end unit 26 the leading end unit 24 of the next segment, and the cavity 36 at the right end for molding the trailing end unit 24 of the next segment. Only the parts 33 and 26 of the previous segment are shown, the new segment yet to be molded is not shown. After each molding cycle, still to be described, when the mold halves are separated, ejector means (not shown) will free the just-molded segment, so it can be advanced as shown by the arrow 60. Subgates 38 provide passageways for the molten plastic. During the molding process, inert core pins 42, 43 mounted on the top mold part 31 are positioned in each cavity where a hole 16 is to be formed. The lateral spacing of the core pins 42, 43 is determined by their mounting in the top core half 31.

The end unit 26 has a hole 16 molded into it that is in pitch with all the other holes 16 in the insulating segment 22 which will in a later process have interconnect devices (pins/socket/etc.) inserted into them. After the first (called previous) discrete segment is molded and cooled, the mold halves are separated and the just-molded segment is ejected and indexed for the next cycle of the mold. After the mold halves are separated, the discretely molded previous segment is ejected from the mold cavity and indexed by a mechanism such as the motor driven gears 44 shown to the proper position for the next molding cycle. In this position, the unit 33 next to the interlock end unit 26 as well as the latter are both retained or reinserted in the end cavities 34, 35 of the mold. When the mold halves are closed in preparation for the next molding cycle, the core pins 42 of the two end-most positions 34, 35 go into the holes of the unit 33 next to the interlocked units and the end unit 26 into the cavity bottom if a through-hole is to be made. This serves to assist in the final location of the previously molded segment with relation to the cavity which will mold the next segment. Any minute error in the initial location of the previously molded segment is corrected by the positive positioning provided by the two core pins 42 going into the two holes in the two units 33, 26 which remain in the mold and whose lateral spacing is fixed by the mold.

The next cycle of the mold fills the cavities with molten plastic, and encapsulates the trailing end unit 26 inside the overmolded part 24 of the next segment. The design of the interlock feature is such that the interlock joint is not the weak joint of the system. This is obtained by making the strength of the trailing end and leading units approximately the same, so that the combined strength of the overmolded interlocked joint is approximately the same as that of the middle units, which makes the notched regions the weakest links in the strip. In a preferred embodiment, substantially equal strength is obtained by a configuration of the trailing end 26, at the cross-sectional area indicated by 70 in FIG. 4B, that is substantially the same as the cross-sectional area at the smallest section of the web, indicated at 71 in FIG. 4A. In other words, even in the molded state (prior to interconnect device insertion into the insulator), the interlock joint is stronger in tension, bending and twisting than the webs between the notches 14 that separate each unit of the discretely molded segment. This is an important feature so that the process that follows the injection molding, typically interconnect device insertion, can utilize the full range of flexibility and strength of the discretely molded segments, and not be limited by the joint at the interlocking units.

A further feature of the invention is that, even though the design is such that the interlock area is not the weakest link in the strip, a factor of safety is achieved by device insertion. Once a pin or other electrical or mechanical part is inserted into the aligned holes 16 that is the trailing end unit 26 and the over-molded material from the subsequent mold cycle forming the leading end unit 24, the two discrete segments are truly locked together. This is an important feature because, even though the interlocking mechanism is designed to be stronger in tension, bending and twisting than the webs of the discretely molded segments, improper processing conditions or the need for certain materials which may not fuse together during molding, may lead to the condition where eventually the end unit 26 from the previous segment can be removed from the encapsulating material 24 of the next segment. Once, however, a pin for example, is inserted into the aligned holes 16, the two segments are positively locked together and a higher strength preventing separation is achieved.

Another benefit of the invention is that, when the molten plastic is injected into the cavity, it is done so at an extremely high pressure. In the design described in the '622 patent, the protuberance from the previous segment which extends into the cavity segment will experience high stresses from this high pressure molten plastic. This stress can damage or weaken the protuberance resulting in a weak joint which is undesirable. In the present invention, the inner end unit 26 is not free to move or flex in the cavity, as it is held tightly in position by the core pin 42 that goes through the hole in it, thereby securing it in place. Because the end unit can not move when subjected to the flow of molten plastic at such high pressures, it will not be damaged or weakened in the injection molding process, and will retain its mechanical properties, providing a strong interlocking joint.

The indexing mechanism 44 is easily controlled to advance each previous segment to the proper position for the core pins 42 to align same for the next molded segment. The positive alignment provided by the core pins insure proper unit to unit pitch.

Figure 4:
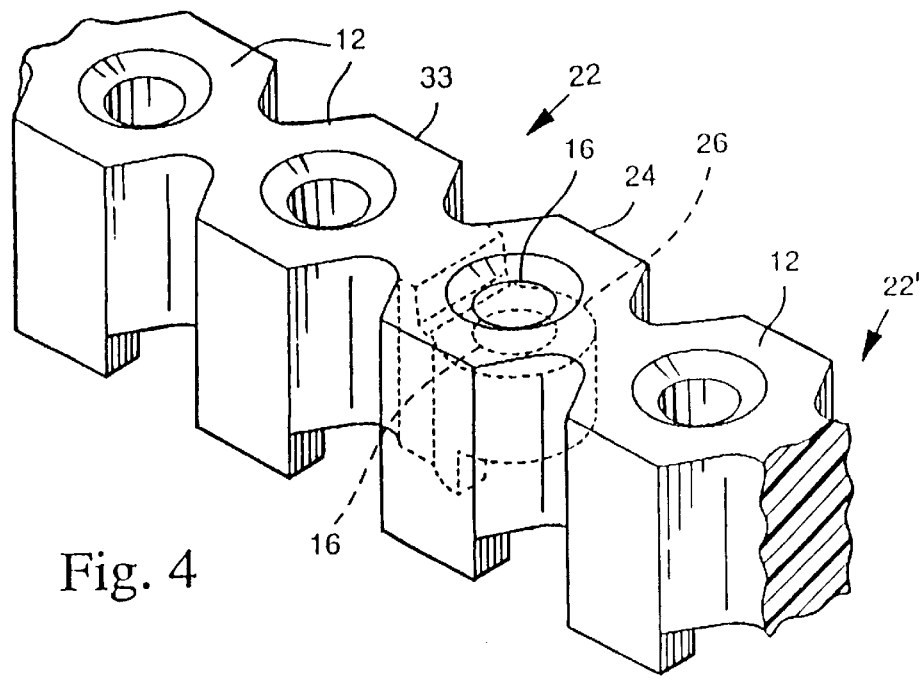
FIG. 4 is a perspective view showing how the end regions of adjacent segments form an interlocking structure.
Figure 4A:
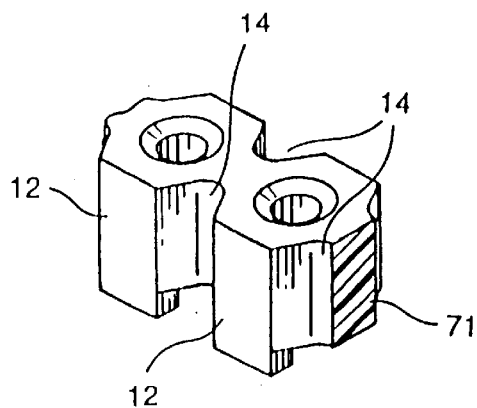
FIGS. 4A and 4B are cross-sections of the structure of FIG. 4 taken along the lines 4A—4A and 4B—4B, respectively, of FIG. 6.

FIG. 4 shows at the left the previous segment 22 with trailing end unit 26 nesting within the overmolded leading end unit 24 of the next segment 22', with their respective holes 16 aligned to received a common electrical or mechanical element.

As shown in FIG. 7, as the continuous strip 48 formed of successive interlocked molded segments 22 is molded in this step-by-step, indexing process, it can be passed through a known inserter machine 50 for inserting pins or other elements into some or all of the holes 16 of the strip, and then the resultant strip 10 wound up in a continuous fashion on a reel 52 for distribution to a user. From the reel 52, the user at a PCB manufacturing station can unreel the strip 10 either manually or automatically by machine—shown in FIG. 8 with tab electrical connectors 54—and as described sever sections with the desired number of tabs for mounting onto a PCB by an inserter machine.

Figure 7A:
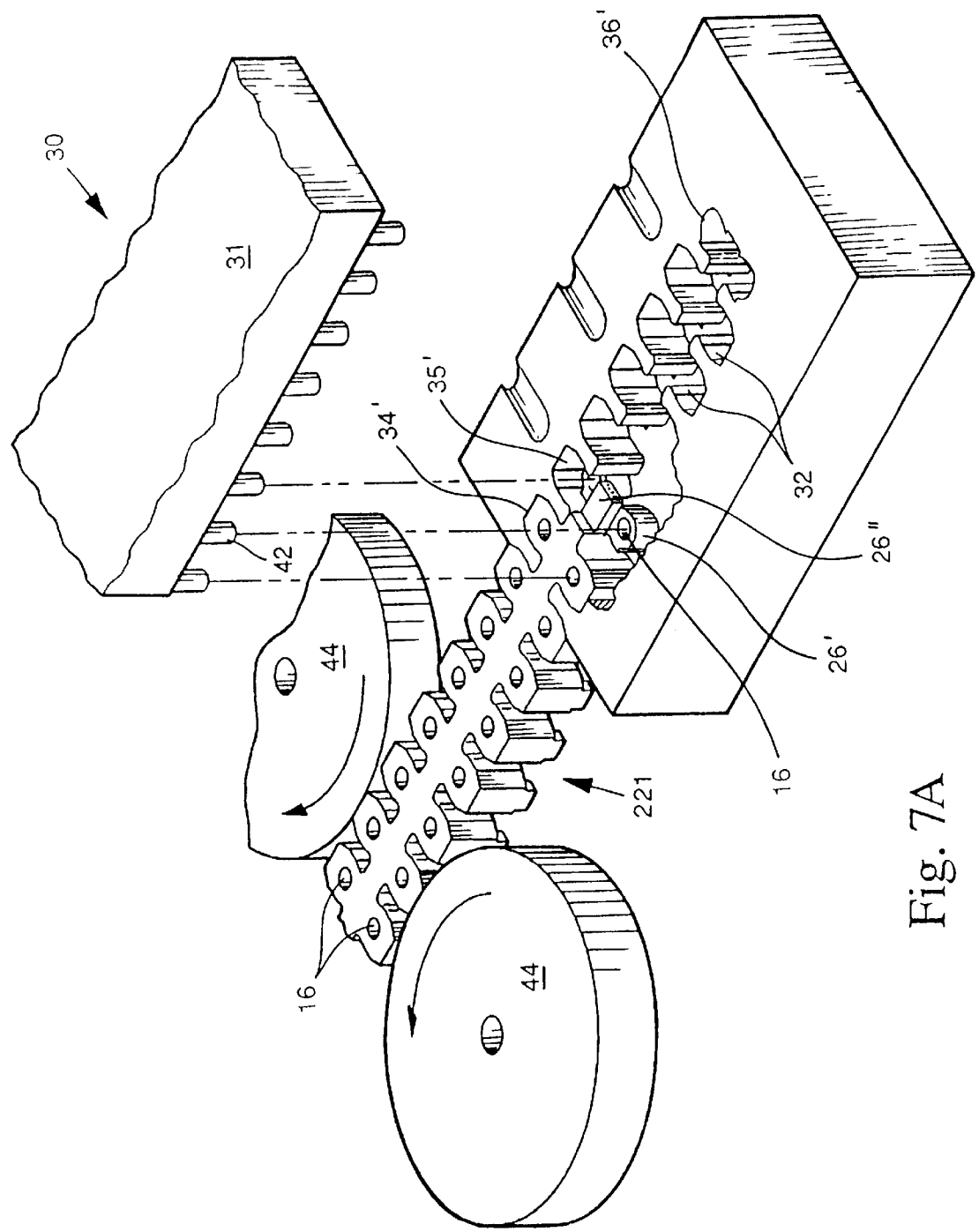
FIG. 7A illustrates manufacture of a modified continuous strip.
Figure 8:
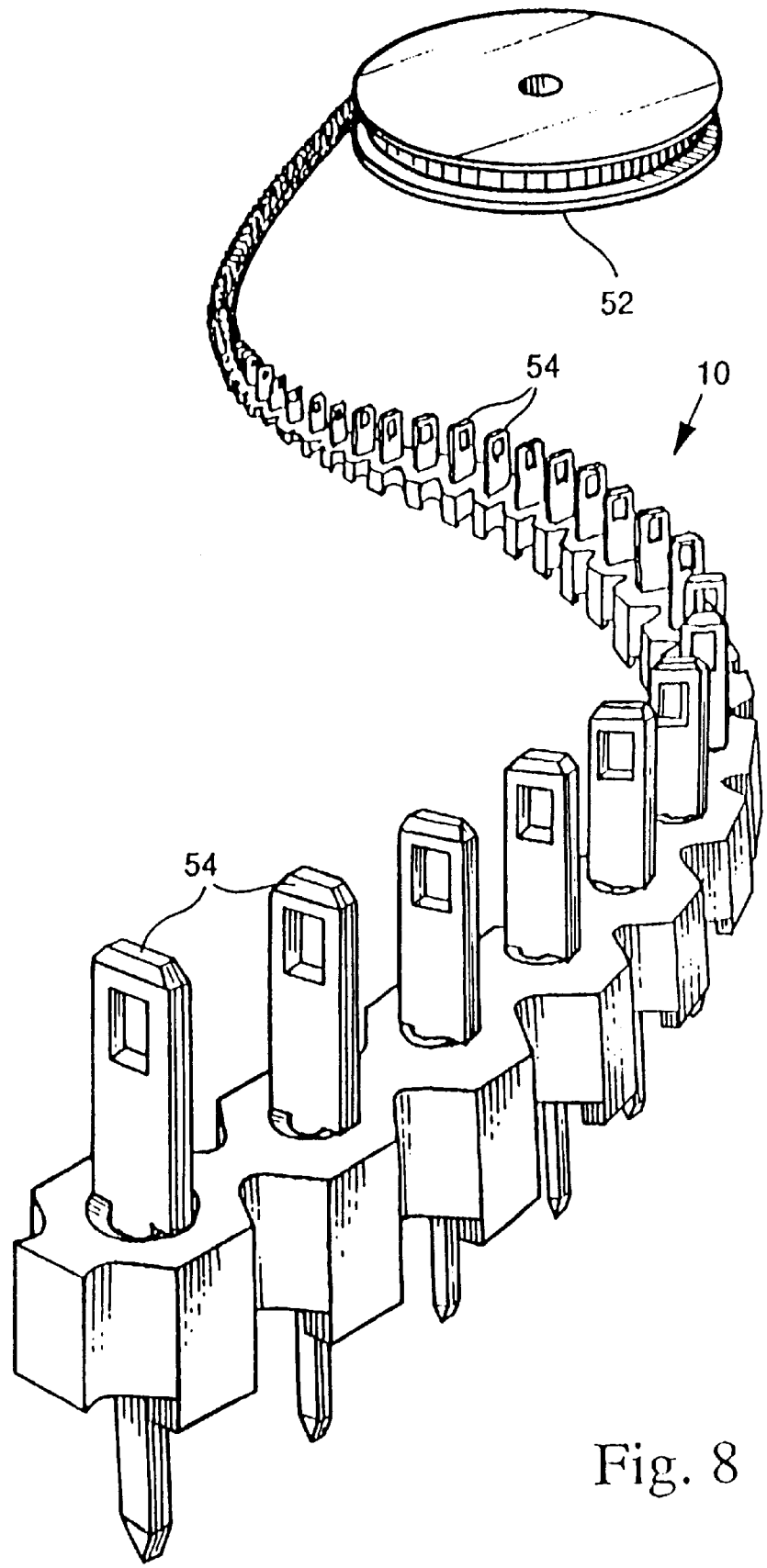
FIG. 8 illustrates how the user would receive a reeled continuous strip.

FIG. 7A shows fabrication of a dual-position header 22', similar to that shown in FIG. 2, in accordance with the invention. It differs from the scheme shown in FIG. 7 in that the previous partially-molded trailing end unit 26' is approximately one-half of the final unit shown next to it at its left and includes the lower half 26" of the part between the pin apertures 16. As before, the cavity 35' next to the end cavity 34' receives the trailing end unit 26' of the previously molded segment and also the overmolded leading end unit of the next segment, and the cavity 36' at the right end is used for molding the trailing end unit of the next segment.

While the more common application of the invention will involve electrical contacts, such as pins, sockets, tabs, terminals and the like, for receiving electrical connectors, there are also mechanical applications of the invention. One such example can be found in U.S. Pat. 5,148,596, (also incorporated herein by reference) which, in the embodiment disclosed in FIGS. 18–22, describes the insertion of posts on a PCB to serve as mechanical guides for electrical connectors. Such posts can also be inserted in holes in the continuous molded strip of the invention, and positions containing one or more posts severed from the continuous strip for mounting on the PCB. In this instance, the posts need not extend completely through the holes in the strip, as would normally be preferred for electrical contacts where the portions protruding from the bottom can be used for mounting of the header on the PCB, as well as for making additional circuits connections on the opposite side of the PCB. It will also be appreciated from this application that the holes in the strip need not be through-holes, but can also be blind holes for receiving mechanical or electrical parts.

Similarly, while the more common and preferred arrangement employs evenly spaced through-holes with each hole in both the end and middle units filled with an electrical contact, there can be uses for uneven patterns of contacts. Thus, holes are not essential in all the units, nor are contacts essential in all the holes. Holes, through or blind, need only be located where needed or to receive a core pin.

Similarly, with a strip of equally spaced holes and contacts, it is preferred to mold sets of notches separating each contact, allowing any desired header length to be severed at any of the notched separators. However, if the user has a need for, for example, 3-pin headers, then notches need only be provided between every third and fourth pin where severing will occur. Alternatively, if the user needs both 2-pin and 3-pin headers, then the notches need only be provided at 3 and 4 pin positions, thus where the user intends to sever discrete header components.

It will also be appreciated that other structures capable of weakening the strip along discrete lengths thereof, for easy separation of the strip at the weakened regions, can be substituted for the notches.

The number of units provided in each segment is not critical. It can vary from 3 to more than 50, depending on mold and part size. A typical value would be about 32 units with a pitch of about 0.1 inches, a height of about 0.1 inches, for 0.025 inch square standard pins, and with a web width, between the notches, of about ⅓ the unit width.

As will be observed in FIGS. 3 and 5, the trailing end unit 26 forms a kind of knob-shaped in-line protuberance with a recessed or reduced width section 60 behind the front axial surface. As a result, material of the overmolded leading end unit 24 extends into this reduced width section which enhances the interlocking of the two segments. As an alternative, if the position is not needed by the customer, the core pin 42 which engages the hole 16 in the end unit 26 may be omitted. As a result, injected plastic will fill that hole 16 and provide additional strength to the assembly of segments. The remaining core pin 42 will still function for alignment of adjacent segments. Other core pins 43 may also be eliminated if desired.

The use of semi-continuous injection molding offers several advantages over extrusion. Holes with lead-ins—the bevels 18—may be molded directly. Higher-temperature plastics can be used. Greater dimensional accuracy is possible. Pitch is more consistent. The parts are cleaner since no plastic need be removed as is required for extrusion. Also secondary machining or punching operations necessary with extrusions are eliminated.

Figure 4B:
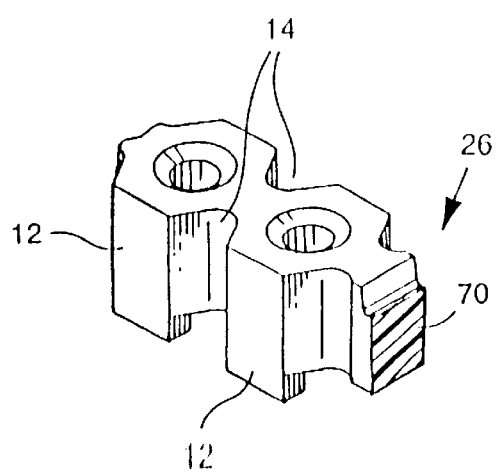

The shape and size of the knob-shaped end 16 is preferably chosen such that its strength is approximately the same as the strength of the overmolded plastic that encapsulates the knob-shaped end, so together they provide a strength of plastic substantially equal to that of one of the middle units 12, which contributes to the strength of the interlocking structure thus formed. Substantially equal strength can be obtained by making the volume of the trailing end 16 approximately the same as the volume of the overmolded plastic. To further ensure that the notched region represents the weakest link to ensure severing at the proper locations, in a further prepared embodiment, preferably the cross-section of the section 70 shown by hatching in FIG. 4B is equal to or larger than the smallest cross-section 71 through the center of the web between a pair of notches 14.

The core pins need not be round, as shown. They can also be rectangular, square or otherwise shaped as required for the part to be subsequently inserted.

The previous specific embodiments use core pins in the mold to maintain segment hole pitch and to form the holes in the injected plastic, the core pins being removed following each molding cycle and reused in the next cycle. In this embodiment, described and claimed in the second copending application, the actual electrical or mechanical parts intended to be part of the finished product are incorporated in each molded segment as it is being molded. In effect, the removable core pins are replaced by the electrical or mechanical parts which remain in each molded segment, thereby omitting the need for the separate insertion step illustrated at 50 in FIG. 7. Instead of placing manually or by machine individual electrical or mechanical parts over each cavity which will form the individual insulated units, it is preferred that the electrical or mechanical parts are themselves formed as an integral assembly using one or more carrier strips for the individual parts. This has the advantage that the pre-formed strips of parts ensures proper placement and spacing of the parts. In the description that follows, this embodiment will be illustrated with electrical metal pins used to exemplify the electrical or mechanical part though it will be understood that the invention is not limited thereto.

Figure 10:
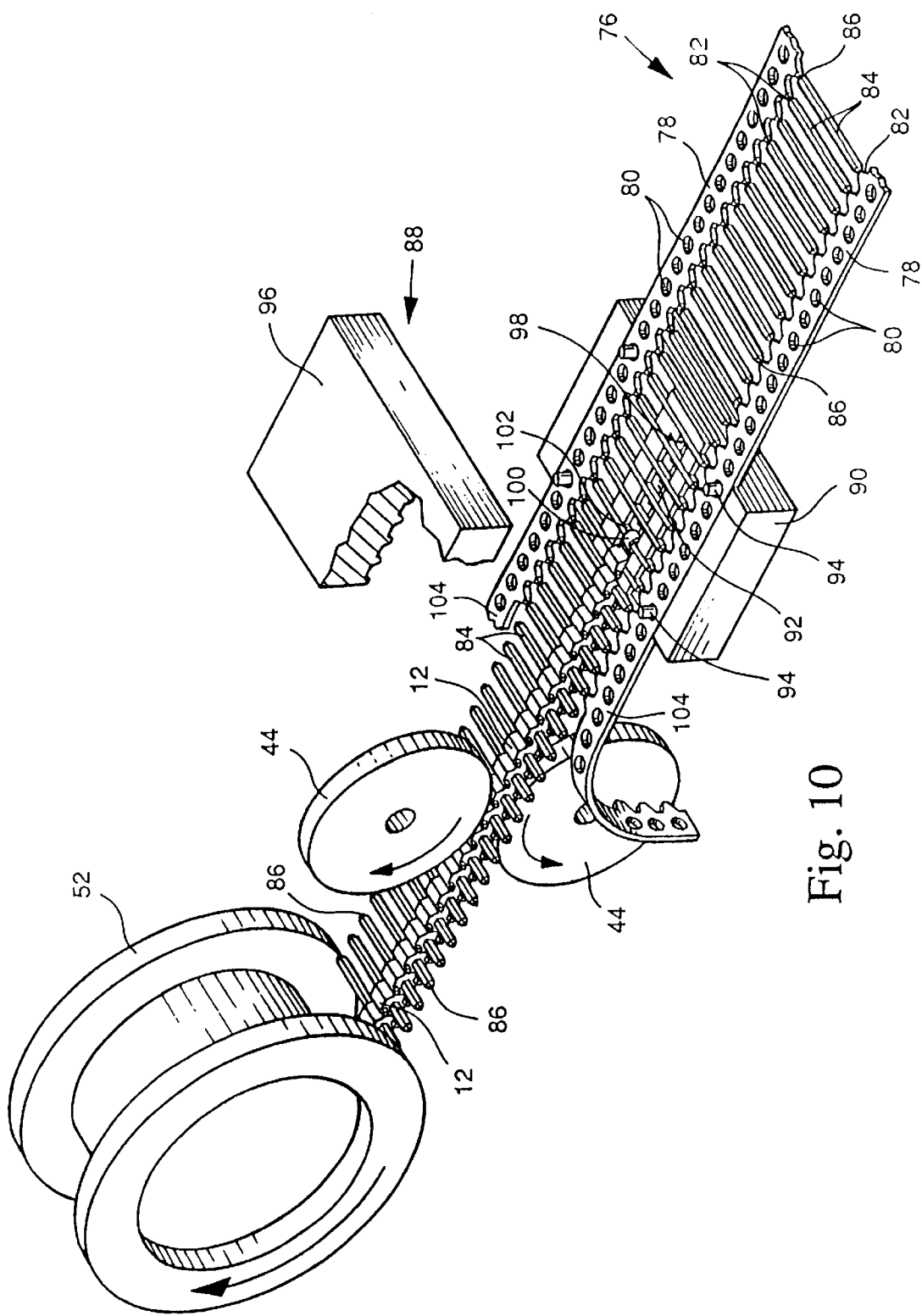
FIG. 10 is a view similar to FIG. 7 illustrating one way in accordance for manufacturing the embodiment of FIG. 9.

FIG. 10 illustrates the manufacturing operation. From a suitable strip of electrical contact material, e.g., of a copper alloy such as brass, there is formed by a standard stamping operation the structure shown at 76 at the right of the figure. That structure comprises opposed carrier strips 78 containing a sequence of indexing holes 80 between which are supported at weakened sections 82 a plurality of spaced pins 84. The weakened sections 82 simultaneously form beveled ends 86 at opposite pin ends. This structure makes it very easy to transport a plurality of pins, and allows them to be supplied, for example, from a reel of carrier strip material. In addition, the carrier strips are readily detached at the weakened sections 82 leaving behind individual pins 84. The formation of the stamped strip is also simplified by supplying the unstamped strip from a reel and following the stamping reeling up the resultant structure for further processing. This basic concept of reel-to-reel processing is described in U.S. Pat. No. 5,337,468, whose contents are incorporated herein by reference. In the present instance, the structure can be supplied from a reel (not shown).

The strip 76 is supplied to a mold 88 somewhat similar to the mold 30 in FIG. 7. The indexing holes 80 provide a very convenient means for indexing the strip 76 the desired amount. The bottom half 90 of the mold 88 has, as in FIG. 7, a row of cavities 92 to form individual insulated units 12 and the projecting portion 26 and in this embodiment each of the cavities is overlaid by one of the pins 84 supported on the carrier strips 78. The latter are readily located by locating pins 94 on the bottom mold half 90 and intended to be engaged by the upper mold half 96 when the mold is closed. When molten plastic is injected along the usual sprues and channels (not shown), the plastic molds around each of the pins 84 forming a series of units 12 still supported by the carrier strips 78. The leading cavity 98 is smaller than the others producing the desired smaller projection 100 needed for the trailing end unit of each molded segment. This can be observed at the opposite mold end of the previously-molded segment. Hence, as before, when the previously molded segment is ejected from the mold and indexed together with the incorporated pins 84 for the next molding cycle, the smaller projecting part 100 is placed in the trailing cavity 102 of the mold, and during the next molding cycle is overmolded with more plastic material forming the strong interlocking structure of the invention with a reinforcing pin 84 already in place. Subsequently, as shown at 104, the carrier strips 78 are detached as by severing since a continuous strip of molded segments with pins in place now exists making the carrier strips unnecessary. Indexing means for the completed strip are shown at 44, and the finished product can then be reeled up 52 as before.

Figure 9:
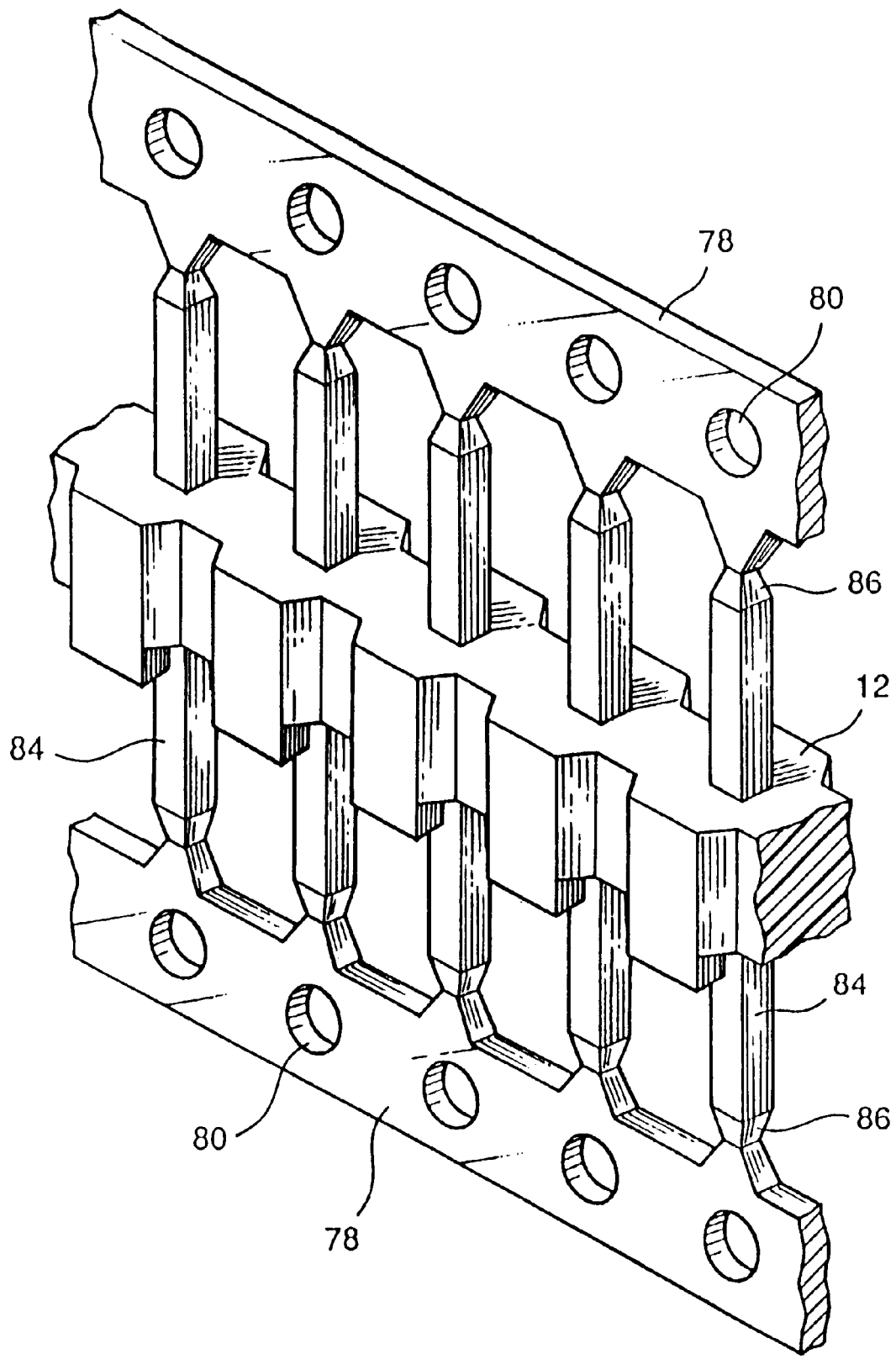
FIG. 9 is a partial perspective view of another preferred embodiment.

FIG. 9 is a perspective view of the product as it exits the mold 88 with the carrier strips 78 still in place.

It will also be appreciated that only some of the units 12 need incorporate an electrical or mechanical part as a result of the molding process. It is still possible following the teachings of the FIG. 7 embodiment to insert additional electrical or mechanical parts into any units that may lack such a part at a later time. Preferably, however, at least the units 26 that constitute part of the interlocking structure should incorporate an electrical or mechanical part for reinforcement purposes.

Figure 11:
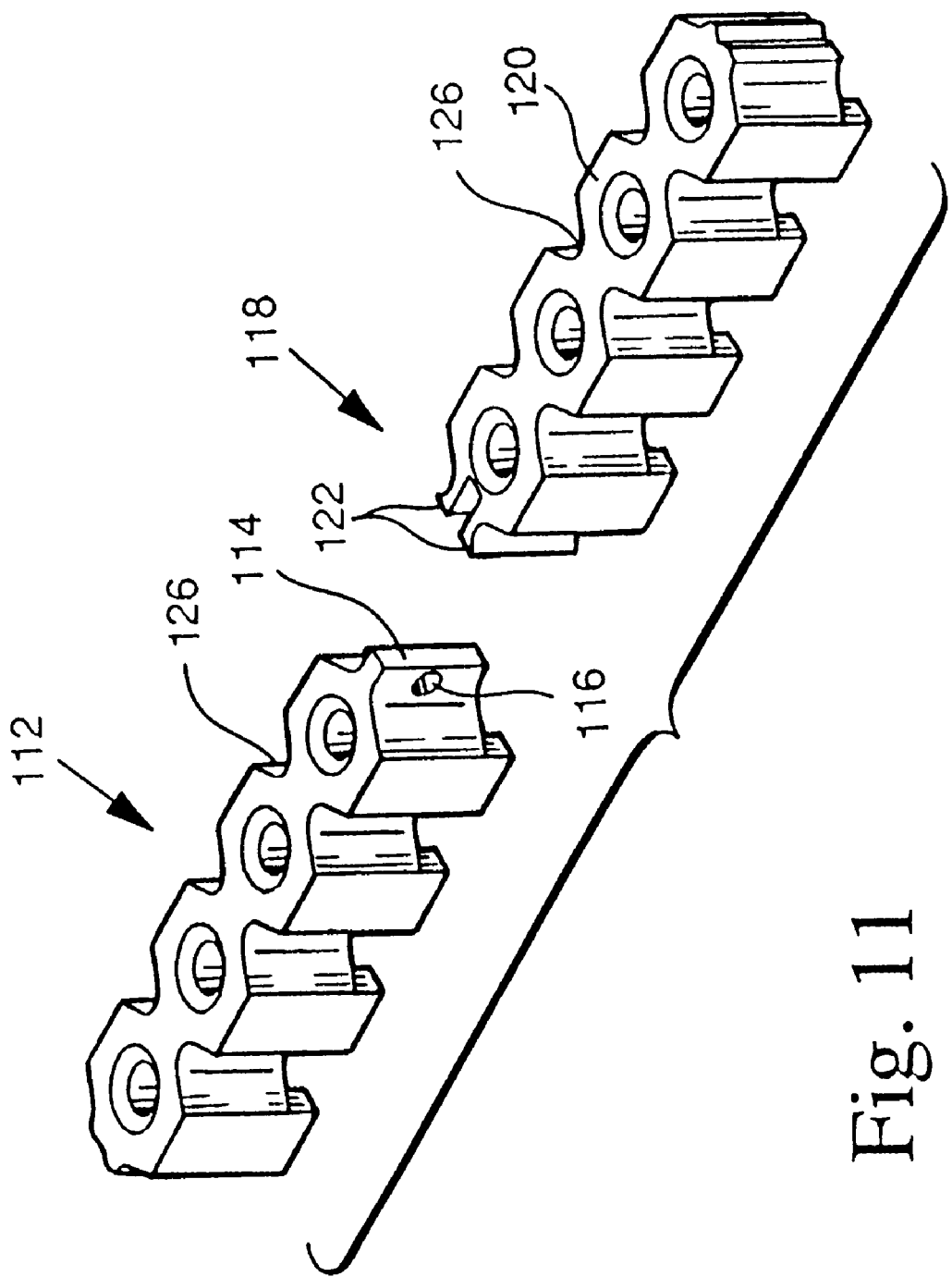
FIG. 11 is a perspective exploded view of adjacent ends of successive segments of one form of continuous strip according to one aspect of the present invention.

In the embodiments described in the first copending application, the holes for the electrical or mechanical parts are formed by veretical core pins and in the preferred embodiment a hole is also formed in the interlocking structure for receiving an electrical or mechanical part if needed. In the embodiments to be now described, no visible hole exists in the interlocking structure, and the interlocking structure is positioned in line but between the sequence of components where the strip may be separated by the user to form individual components. The preferred interlocking structure in this case is of a tongue and groove configuration in which the interlocking is enhanced by the provision of a hole in one of the mating parts, which hole is filled with molded plastic material during the overmolding step. FIG. 11 illustrates one form of interlocking structure in accordance with this aspect of the present invention.

Figure 12:
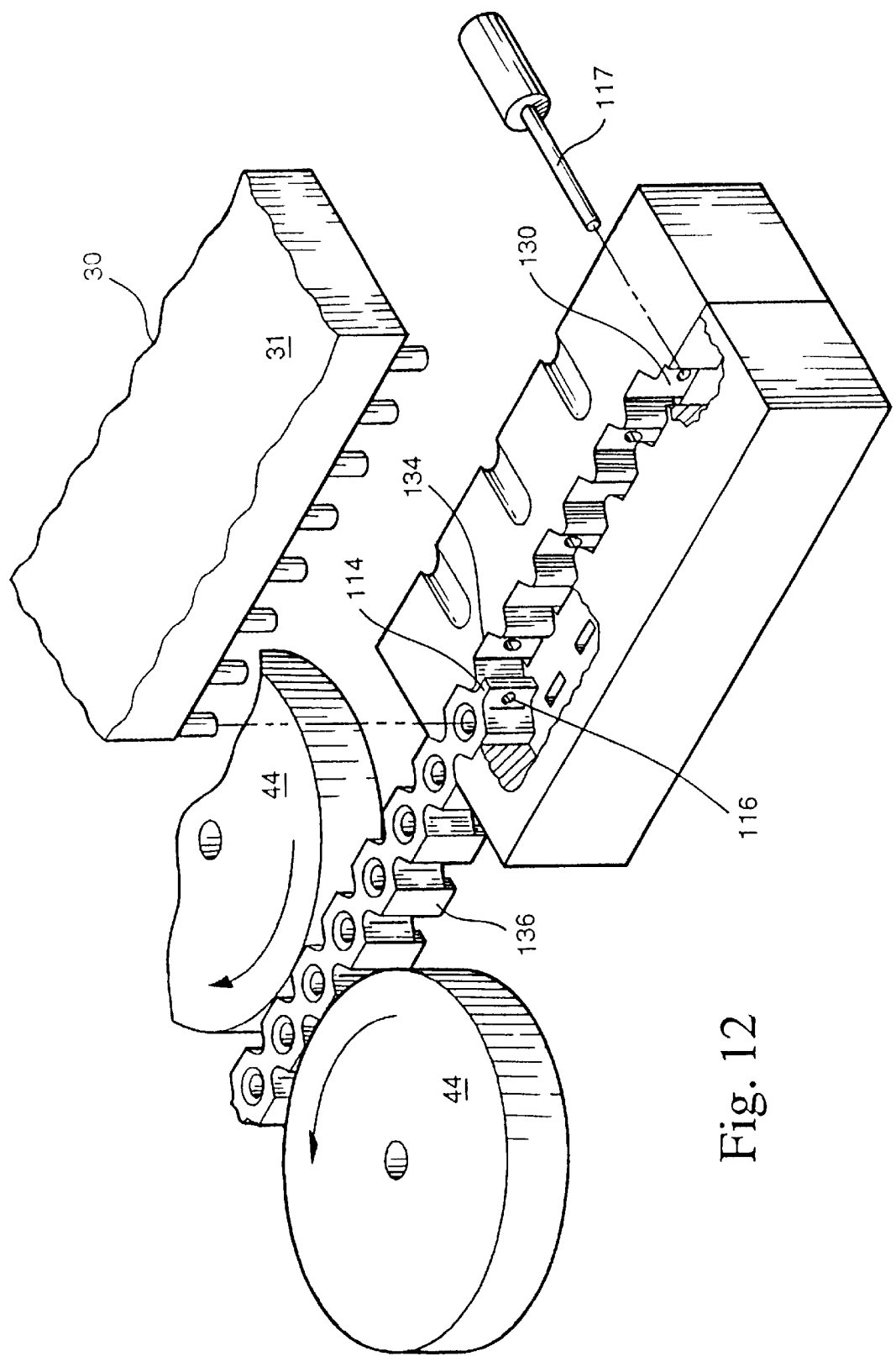
FIG. 12 is a perspective view illustrating manufacture of the strip of FIG. 11.

The trailing projecting portion formed on a segment 112 during the previous molding cycle comprises a tongue-shaped member 114 molded with a hole 116 formed by a core pin 117 positioned horizontally in the last mold cavity (see FIG. 12). As in the other embodiments, the trailing projecting portion is reinserted back into the first mold cavity and during the next molding cycle is overmolded by a leading portion 1 18 in the shape of a groove of the next segment 120 with vertical parts 122 flanking the tongue 114 and with a molded cross bar (not shown) extending between the flanking parts 122 and filling the hole 116 in the tongue. FIG. 11 shows the next molded segment 120 separated from the previous segment so that the cross bar, whose position is indicated by numeral 116, is visible. The strip of parts formed by this process looks similar to that in FIG. 3, except that the linking section, the overmolded part 114, 122 interlocking the successive segments together, is somewhat longer in the illustrated embodiment The interlocked tongue and groove, with the cross bar 124 molded through the hole 116, forms a strong interlocking structure at the location of a notched area 126 where individual sections of the resultant strip can be separated. If desired, the parts of the interlocking structure can be reversed in position, with the projecting portion 118 now constituting the previous molded part and provided with transverse holes by a lateral core pin in the flanking parts, which are filled with a cross bar molded to the tongue when the overmolded tongue is molded into the flanking parts during the next molding cycle. In this embodiment, no pin position results where the discrete segments are linked together.

FIG. 12 shows one embodiment of a mold suitable for molding the embodiment of FIG. 11, wherein the same reference numerals as in FIG. 7 are used to designate similar parts. The first mold cavity to mold the tongue 114 is shown at 130, and uses the transverse core pin 117 to form the hole 116. The last mold cavity where the overmolding occurs is shown at 134. The resultant strip is designated 136.

In the embodiments so far described, a strip is formed to receive or actually contain electrical or mechanical parts. In the next series of embodiments, the product is a sequence of molded components of plastic or other moldable material which need not be provided with electrical or mechanical parts before reeling up for delivery to a user. There are many applications for, for example, small plastic components of many shapes, sizes and configurations which are used separately or in assemblies for automation processes. Typically, this is carried out currently by forming discrete parts and packaging them in an embossed carrier tape (tape and reel concept per EIA-STD-481), or in package trays, tubes or other multiple feed carrier-supported devices. As described above, the assembly process involves removing an individual component from its carrier, as by, for example, a pick and place machine, and assembling it as required. This has the disadvantages that a secondary operation is required to package the components in their carrier, and when the process is completed scrap is left behind in the form of the carrier that must be disposed of The product resulting from this aspect of the present invention is a continuous molded strip of components with adjacent components connected together by the interlocking structure between discrete molded segments of one or more components and allowing for separation of individual parts from the strip at each link between components in a scrapless process, i.e., no plastic slug removal step is needed and no excess material is left behind. If desired, strips can also be manufactured with plastic slugs for parts that require a specific pitch between parts for future manufacturing processes. The interlocking structure is configured such that molten plastic material can flow completely around at least a part of the previously molded projecting portion of the interlocking structure, thereby securing it to the following segment. Sections of the interlocking structure are completely encapsulated during the molding process and will not be visible to an observer in the completed strip. Preferably, the interlocking structure is configured such that, when the individual components are separated from the strip, the parts of the interlocking structure that are completely encapsulated are thus secured and will not separate from any individual part. This is important where elements of the assembled component must be free of any loose plastic material to avoid contamination of elements of the assembly. The size of the interlocking structure may be used to control the separation force of the individual parts, which separation force, typically by shearing the link, preferably is of the same order of strength of the link between adjacent molded components. As in the other embodiments, the resultant strip of molded components may, if desired be reeled up on a reel which can be mounted on known automatic process machines equipped with a feeding device for separating individual parts from the strip and feeding them to the assembly support section. While not intended to be limiting, this aspect of the invention can be important for the manufacture of very small parts with a miniature interlocking structure that fits within a plastic section smaller than about 0.5 inches.

In the examples that follow, which is not meant to be limiting, the parts are plastic containers about 0.5 inches square with a thickness and linking section that is approximately 0.03 inches.

FIGS. 13A, 13B, and 13C illustrate the part as if it were individually molded, so that the interlocking structure is visible. The part 200 comprises a shallow base 202 having a recessed area 204. The part 200 is linked at its rear 210 and front edges 212 (rear and front are relative to the molding cycle) to form a longitudinally-dimensioned strip of mutiple linked parts during the semi-continuous molding process. The interlocking structure 214 projects rearwardly of and extends laterally along the rear edge 210. It comprises four generally T-shaped elements 216 interconnected by reduced thickness parts 218 which are spaced from the the rear edge wall to form three completely bounded openings 220 in the center and two partially bounded openings 222 at opposite ends. As in the other embodiment, when the previously molded interlocking structure 214 is reinserted back into the leading mold cavity, during the next molding cycle molten plastic flows and not only generates the next succeeding component but also fills in 223 all the openings 220, 222 forming a solid interlocking link indicated at 224 in FIG. 13D that tightly connects and bonds the next segment 226 to the previous segment 228 in a continuous strip. Preferably the cavity is shaped to form a small bevel 230 or score mark at the adjacent edges to allow easy separation by severing along the bevel during subsequent operations.

Figure 14B:
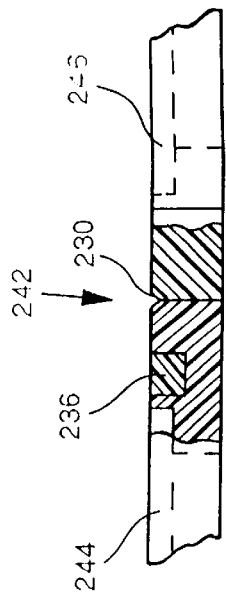
FIGS. 14A and 14B are views similar to FIGS. 13C and 13D, respectively, of another form of plastic part in accordance with the present invention.
Figure 15B:
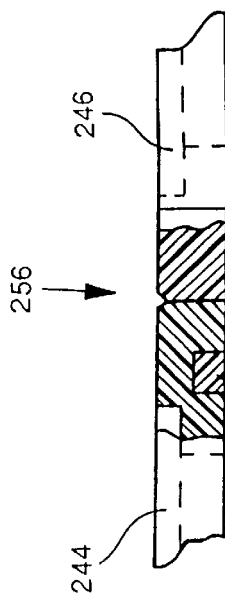
FIGS. 15A and 15B are views similar to FIGS. 13C and 13D, respectively, of another form of plastic part in accordance with the present invention.
Figure 14A:
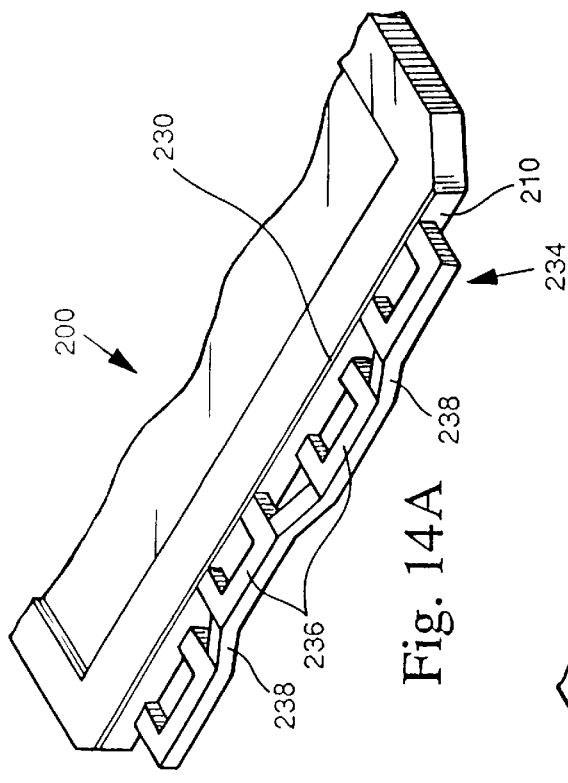
Figure 15A:
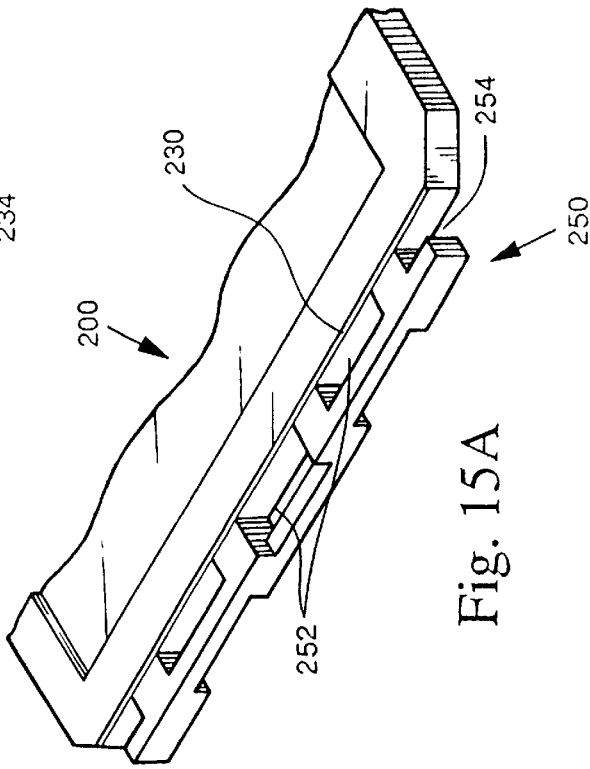

FIGS. 14A and 14B, 15A and 15B, and 16A and 16B are, respectively, views similar to that of FIGS. 13C and 13D of different interlocking structures in accordance with the invention. In the FIG. 14A embodiment, the structure 234 comprises four U-shaped structures 236 connected by angled links 238 forming seven bounded openings 240 which when overmolded as shown in FIG. 14B at 242 are filled with plastic thus locking together the next segment 244 to the previous segment 246 in a continuous strip. The interlocking structure 250 in the FIG. 15A embodiment is a variation of that shown in FIG. 13C at 214 and also forms three partially bounded openings 252 in the center and two partially bounded openings 254 at opposite ends. The interlocked segments shown in FIG. 15B at 256 result when, as before, the plastic fills in the openings partially encapsulating the interlocking structure 250. The interlocking structure 258 shown in FIG. 16A comprises a shelf 260 provided with five openings 262 subsequently filled in with plastic during the next molding cycle as shown at FIG. 16B. The four embodiment last described have in common a laterally extending and rearwardly projecting interlocking structure with openings and configured and positioned such that it is partially or completely encaspsulated during the next molding cycle guaranteeing that, during subsequent separation into individual parts, no loose plastic will separate from the individual units that could possibly corrupt or interfere with use of the severed part. Another feature is that the configuration shown and described lends itself to the manufacture of miniature plastic components in continuous strip form. For example, the part 200 shown in an end view in FIG. 13B can have a base thickness (the vertical dimension in FIG. 13B) as small as 0.03 inches, a width of about 0.5 inches and a length of about 0.5 inches. Following the continuous molding cycle, the resultant strip of components, as in the other embodiments, can be reeled up on a reel for distribution to the user.

While the invention has been described in conjunction with specific embodiments, it will be evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A continuous strip of separable pin headers comprising:
   (a) a consecutive series of injection-molded segments of moldable material,
   (b) each segment comprising a consecutive series of integrally connected but severable header units comprised of first leading and second trailing end units and a plurality of middle units between the end units, said middle units each being of moldable material and separated along their length from each other,
   (c) except for end segments, one of the first and second end units of each segment having a portion overmolding a projecting portion of the other of the first and second end units of an adjacent segment whereby successive segments are integrally coupled by their respective overmolded and projecting portions of the first and second end units and with the projecting portion of the other of the first and second end units of each segment having had a hole or recessed portion filled with molded material of the overmolding portion of the one of the first and second end units of the adjacent segment, said projecting portion of the other end unit comprising a rearwardly projecting portion extending approximately in line with the strip,
   (d) the integrally coupled segments forming an elongated strip of molded header units,
   (e) a plurality of spaced approximately in-line electrically-conductive pin components provided in and along substantially the length of said elongated strip, whereby one or more individual header units containing pins can be severed from the strip as desired.

2. The strip of claim 1, wherein the header units are separated by severance means.

3. In combination with the strip of claim 1, a reel, said elongated strip of header units with pins being wound up on the reel.

4. The strip of claim 1, wherein the hole or recessed portion in the projecting portion of the other end unit extends generally perpendicular to the plane of the strip.

5. The strip of claim 1, wherein each of the segments comprises at least 3 header units.

6. A continuous strip of separable units containing spaced electrical or mechanical components comprising:
   (a) a consecutive series of injection-molded segments of moldable material,
   (b) each segment comprising a consecutive series of integrally connected but severable units comprised of first leading and second trailing end units and a plurality of middle units between the end units, said middle units each being of moldable material and separated along their length from each other,
   (c) except for end segments, one of the first and second end units of each segment having a portion overmolding a projecting portion of the other of the first and second end units of an adjacent segment whereby successive segments are integrally coupled by their respective overmolded and projecting portions of the first and second end units and with the projecting portion of the other of the first and second end units of each segment having had a hole or recessed portion filled with molded material of the overmolding portion of the one of the first and second end units of the adjacent segment, said projecting portion of the other end unit comprising a rearwardly projecting portion extending approximately in line with the strip,
   (d) the integrally coupled segments forming an elongated strip of molded units,
   (e) each of the units having a hole for receiving an electrical or mechanical component,
   (f) the projecting portion also having a hole for receiving an electrical or mechanical component and the overmolding portion allowing access by the electrical or mechanical component to the hole in the projecting portion,
   (g) a plurality of spaced approximately in-line electrical or mechanical components each mounted in one of the holes in the units including the hole in the projecting portion along substantially the length of said elongated strip, whereby a desired pitch distance between the mounted components is preserved and one or more individual units can be severed from the strip as desired.

7. The strip of claim 6, wherein each of the segments comprises at least 3 units, the units are header units, and the electrical or mechanical components are header pins.

8. In combination with the strip of claim 6, a reel, the strip being wound up on the reel.

9. A method of forming a continuous elongated injection-molded length of moldable material comprising a plurality of longitudinally spaced components having a desired pitch distance, comprising the steps:
   (a) providing a mold shaped to form one segment of moldable material, said one segment comprising a consecutive series of connected, integral units having a given thickness and comprised of first and second end units and a plurality of middle units between the end units, at least the second end unit forming a projecting portion approximately in line with the units, said projecting portion being provided with recessed areas,
   (b) introducing into the mold molten material and allowing same to cool to form a first segment of moldable material with the second end unit comprising the projecting portion with the recessed areas,
   (c) removing from the mold the first segment and reinserting the projecting portion of the first segment in the mold,
   (d) introducing into the mold molten material and allowing same to cool to form a second segment with first and second end units and middle units with the first end unit of the second segment overmolded with and at least partially encapsulating the projecting portion of the second end unit of the first segment and with the recessed areas in the projecting portion filled with molded material whereby the first and second segments are integrally coupled by their respective overmolded and projecting portions,
   (e) repeating step (c) with respect to the second segment and step (d) to form a third segment integrally coupled with the second segment, and so on, whereby successive segments can be formed and integrally coupled to form an elongated continuous strip of molded segments,
   (f) providing the components along the length of the strip spaced so as to preserve the desired pitch distance.

10. The method of claim 9, further comprising the step of winding the continuous strip onto a reel.

11. The method of claim 9, further comprising the step of, during steps (b), (d), and (e), using core pins spaced by the desired pitch distance for forming holes to receive the components including a hole in the projecting portion.

12. A method of forming a continuous elongated injection-molded strip of moldable material comprising a plurality of spaced approximately in-line components, comprising the steps:

(a) providing a mold shaped to form one segment of moldable material, said one segment comprising a consecutive series of connected, integral units comprised of first and second end units and a plurality of middle units between the end units, at least the second end unit comprising a projecting portion approximately in line with the strip, (b) providing a core pin positioned to form a hole in the projecting portion, (c) introducing into the mold molten material and allowing same to cool to form a first segment of material with some of the middle units incorporating a hole and with the second end unit comprising the projecting portion containing a hole, (d) removing from the mold the first segment and reinserting the projecting portion of the second end unit of the first segment in the mold, (e) introducing into the mold molten material and allowing same to cool to form a second segment with first and second end units and middle units with some of the middle units incorporating a hole and with the first end unit of the second segment comprising a part overmolded with the projecting portion of the second end unit of the first segment and with the hole in the projecting portion filled with a crossbar of molded material whereby the first and second segments are integrally coupled by the overmolded projecting portion, (f) repeating step (d) with respect to the second segment and step (e) to form a third segment integrally coupled with the second segment, and so on, whereby successive segments can be formed and integrally coupled to form an elongated strip of moldable material.

13. The method of claim 12, wherein the projecting portion of the second end unit is configured as a tongue with a lateral hole.

14. The method of claim 13, wherein the overmolded first end unit is configured as a groove with portions flanking the tongue and with a molded crossbar engaging the hole in the projecting portion.

15. The method of claim 12, wherein the projecting portion of the second end unit is configured as a groove with flanking portions with a lateral hole.

16. The method of claim 15, wherein the overmolded first end unit is configured as a tongue positioned within the flanking portions and with a molded crossbar engaging the hole in the groove.

17. The method of claim 12, further comprising the step of winding the continuous strip onto a reel.

18. A method of forming a continuous elongated injection-molded strip of moldable material comprising a plurality of spaced approximately in-line components, comprising the steps:

(a) providing a mold shaped to form one segment of moldable material, said one segment comprising a consecutive series of connected, integral, units comprised of first and second end units and a plurality of middle units between the end units, at least the second end unit comprising a rearwardly projecting portion extending generally laterally of and approximately in line with the strip, said projecting portion having a hole or recessed area, (b) introducing into the mold molten material and allowing same to cool to form a first segment of moldable material and with the second end unit comprising the projecting portion, (c) removing from the mold the first segment and reinserting the projecting portion of the second end unit of the first segment in the mold, (d) introducing into the mold molten material and allowing same to cool to form a second segment with first and second end units and middle units and with the first end unit of the second segment comprising a part overmolded with and at least partially encapsulating the projecting portion of the second end unit of the first segment and with the hole or recessed portion in the projecting portion filled with molded plastic whereby the first and second segments are integrally coupled by the overmolded projecting portion, (e) repeating step (c) with respect to the second segment and step (d) to form a third segment integrally coupled with the second segment, and so on, whereby successive segments can be formed and integrally coupled to form an elongated strip of moldable material comprising plural components.

19. The method of claim 18, wherein the the hole or recessed portion in the projecting portion of the second end unit extends generally perpendicular to the plane of the strip.

20. The method of claim 18, wherein plural holes or recessed portions extend along the lateral direction in the projecting portion of the second end unit.

21. The method of claim 18, wherein each of the components comprise a shallow piece having a small thickness.

22. A method of forming a continuous elongated injection-molded length of moldable material comprising a plurality of longitudinally spaced components, comprising the steps:

(a) providing a mold shaped to form one segment of moldable material, said one segment comprising a consecutive series of connected, integral units having a given thickness and comprised of first and second end units and a plurality of middle units between the end units, at least the second end unit forming a projecting portion approximately in line with the units, said projecting portion comprising a laterally extending strip of material thinner than the given thickness and having an outer edge and provided with recessed areas between the outer edge and the adjacent second end unit, (b) introducing into the mold molten material and allowing same to cool to form a first segment of moldable material with the second end unit comprising the projecting portion with recessed areas between the outer edge and the adjacent second end unit, (c) removing from the mold the first segment and reinserting the projecting portion of the first segment in the mold, (d) introducing into the mold molten material and allowing same to cool to form a second segment with first and second end units and middle units with the first end unit of the second segment overmolded with and at least partially encapsulating the projecting portion of the second end unit of the first segment and with the recessed areas in the projecting portion filled with molded material whereby the first and second segments are integrally coupled by their respective second and overmolded projecting portion, (e) repeating step (c) with respect to the second segment and step (d) to form a third segment integrally coupled with the second segment, and so on, whereby successive segments can be formed and integrally coupled to form an elongated length of molded components.

23. The method of claim 18, further comprising the step of winding the continuous strip onto a reel.

24. A continuous elongated injection-molded strip of moldable material containing a plurality of spaced approximately in-line components along substantially the length of said strip, comprising:

(a) a consecutive series of injection-molded segments of moldable material, (b) each segment comprising a consecutive series of connected integral components comprised of first leading and second trailing end units and a plurality of middle units between the end units, said middle units each being of moldable material and separated along their length from each other, (c) except for end segments, one of the first and second end units of each segment having a portion overmolding a projecting portion of the other of the first and second end units of an adjacent segment whereby successive segments are integrally coupled by their respective overmolded and projecting portions of the second and first end units and with the projecting portion of the other of the first and second end units of each segment having had a hole filled with a molded crossbar of the other of the first and second end units of the adjacent segment.

25. The strip of claim 24, further comprising a reel, said elongated strip of insulating material being wound up on the reel.

26. The strip of claim 24, wherein the projecting portion of the other of the first and second end units is configured as a tongue with a lateral hole.

27. The strip of claim 26, wherein the overmolded one unit is configured as a groove with portions flanking the tongue and with a molded crossbar engaging the hole in the projecting portion.

28. The strip of claim 24, wherein the projecting portion of the other end unit is configured as a groove with flanking portions with a lateral hole.

29. The strip of claim 28, wherein the overmolded portion of the one end unit is configured as a tongue positioned within the flanking portions and with a molded crossbar engaging the hole in the groove.

30. The strip of claim 24, wherein the units are separated by severance means.

31. A continuous elongated injection-molded strip of moldable material containing a plurality of spaced approximately in-line components along substantially the length of said strip, comprising:

(a) a consecutive series of injection-molded segments of moldable material, (b) each segment comprising a consecutive series of connected integral components comprised of first leading and second trailing end units and a plurality of middle units between the end units, said middle units each being of moldable material and separated along their length from each other, (c) except for the end segments, one of the first and second end units of each segment having a portion overmolding a projecting portion of the other of the first and second end units of an adjacent segment whereby successive segments are integrally coupled by their respective overmolded and projecting portions of the second and first end units and with the projecting portion of the other of the first and second end units of each segment having had a hole or recessed portion filled with molded material of the other of the first and second end units of the adjacent segment, said projecting portion of the other end unit comprising a rearwardly projecting portion extending generally laterally of and approximately in line with the strip.

32. The strip of claim 31, wherein the units are separated by severance means.

33. The strip of claim 31, wherein the moldable material is of plastic or metal.

34. The strip of claim 31, further comprising a reel, said elongated strip of material being wound up on the reel.

35. The strip of claim 31, wherein the hole or recessed portion in the projecting portion of the other end unit extends generally perpendicular to the plane of the strip.

36. The strip of claim 31, wherein the projecting portion of the other end unit comprises a single hole or recessed portion which extends generally perpendicular to the plane of the strip.

37. The strip of claim 31, wherein the projecting portion of the other end unit comprises plural holes or recessed portions that extend along the lateral direction in the projecting portion of the other end unit.

38. The strip of claim 31, wherein each of the components comprises a shallow piece having a small thickness.

39. The strip of claim 32, wherein the severance means are sets of notches.

40. A continuous strip of separable pin headers comprising:

a consecutive series of injection-molded segments of a moldable material, the segments including leading and trailing segments;

each segment comprising a consecutive series of integrally connected but severable header units formed of the moldable material and having a leading end and a trailing end, and including at least one partially formed trailing end unit;

at least one unit at the leading end of each trailing segment having a portion overmolding at least one partially formed trailing end unit of an adjacent leading segment whereby successive segments are integrally coupled by their respective overmolded portions of at least one trailing end unit by at least one leading end unit of an adjacent segment, and said at least one trailing end unit of each segment having a recessed portion filled with the molded material of the overmolded portion of the at least one leading end unit of the adjacent segment;

the integrally coupled segments forming an elongated continuous strip of molded header units, said units each having at least one pin receiving hole and being separated along their length from each other, and a plurality of spaced approximately in-line electrically-conductive pin components provided in said pin receiving holes in and along substantially the length of said elongated strip, whereby one or more individual header units containing pins can be severed from the strip as desired.

41. The strip of claim 40, wherein the header units are separated by severance means.

42. In combination with the strip of claim 40, a reel, said elongated strip of header units with pins being wound up on the reel.

43. The strip of claim 40, wherein the recessed portion of the trailing end unit extends generally perpendicular to a plane of the strip.

44. The strip of claim 40, wherein each of the segments comprises at least three header units.

45. The strip of claim 40, wherein the recessed portion includes a hole.

46. A continuous strip of separable pin headers comprising:
- a consecutive series of injection-molded segments of a moldable material, the segments including leading and trailing in-line end portions;
- each segment comprising a consecutive series of at least three integrally connected but severable header units formed of the moldable material and having a partially formed trailing end portion;
- an end portion at the leading end of each trailing segment having a portion overmolding the partially formed trailing end portion of an adjacent leading segment whereby successive segments are integrally coupled by their respective in-line overmolded portions, and said trailing end portion of each segment having a recessed portion filled with the molded material of the overmolded portion of the leading end portion of the adjacent segment;
- the integrally coupled segments forming an elongated strip of in-line molded header units, said units each having at least one pin-receiving hole and being separated along their length from each other; and
- a plurality of spaced approximately in-line electrically-conductive pin components provided in said pin-receiving holes in and along substantially the length of said elongated strip, whereby one or more individual header units containing pins can be severed from the strip as desired.

47. In combination with the strip of claim 46, a reel, said continuous strip of separable pin headers being wound up on the reel.

48. The strip of claim 46, wherein the recessed portion of the trailing end portion extends generally perpendicular to a plane of the strip.

49. The strip of claim 46, wherein the in-line overmolded portions each comprise at least one pin-receiving hole.

* * * * *